(12) United States Patent
Kang et al.

(10) Patent No.: US 7,123,112 B2
(45) Date of Patent: Oct. 17, 2006

(54) COMPLEMENTARY VOLTAGE CONTROLLED OSCILLATOR

(75) Inventors: Dong Kyun Kang, North Potomac, MD (US); Choong-yul Cha, Dae-jeon (KR); Sang-Gug Lee, Dae-jeon (KR)

(73) Assignee: NeoReach, Inc., Bethesda, MD (US)

( * ) Notice: Subject to any disclaimer, the term of this patent is extended or adjusted under 35 U.S.C. 154(b) by 13 days.

(21) Appl. No.: 10/941,585

(22) Filed: Sep. 15, 2004

(65) Prior Publication Data

US 2006/0055477 A1    Mar. 16, 2006

(51) Int. Cl.
*H03B 5/04* (2006.01)
(52) U.S. Cl. .............................. 331/117 FE; 331/177 V
(58) Field of Classification Search .......... 331/117 FE, 331/117 R, 177 V
See application file for complete search history.

(56) References Cited

U.S. PATENT DOCUMENTS 5,475,345 A * 12/1995 Gabara .................. 331/117 FE
6,750,727 B1 * 6/2004 Sutardja .................. 331/117 R
6,765,448 B1 * 7/2004 Wu et al. .............. 331/117 FE

OTHER PUBLICATIONS

IEEE Journal of Solid-State Circuits, vol. 29, No. 3, Mar. 1994—Integrated Continuous-Time Filter Design—An Overview—Tsividis—pp. 166-176.
IEEE Journal of Solid-State Circuits, vol. 33, No. 3, Mar. 1, 1998 Integrated Circuit Technology Options for RFIC's—Present Status and Future Directions—Larson pp. 387-399.

IEEE Transactions on Microwave Theory and Techniques, vol. 49, No. 1, Jan. 2001—Fully Integrated 5.35—Ghz CMOS VCOs and Prescalers—Hung et al—pp. 17-22.
IEEE Journal of Solid-State Circuits, vol. 36, No. 6, Jun. 2001—Ham et al pp. 896-909.
FP 14.7: A Fully Integrated 2.7V.035μm CMOS VCO for 5GHz Wireless Applications—Bell Labs, Lucent Technologies, Peter Kinget.
IF-TU-54 A 5.8 GHz Fully Integrated Low Power Low Phase Noise CMOS LC VCO for WLAN Applications—Bhattacharjee et al—2002 IEEE MTT-S Digest.
IF-TU-54 A 5.8 GHz Fully Integrated Low Power Phase Noise CMOS LC VCO for WLAN Applications—Bhattacharjee et al—2002 IEE MTT-S Digest.

* cited by examiner

*Primary Examiner*—Joseph Chang
(74) *Attorney, Agent, or Firm*—Seyfarth Shaw LLP

(57) ABSTRACT

A voltage controlled oscillator is provided. The oscillator has an oscillator amplifier core formed of a complementary pair of FETs connected with their gates in common and connected to share a bias current. An inductance is connected between the common gates and the common drains of the FETs. The inductance may be an inductor element or an inductance of a physical structure of the circuit, such as a bond wire. The voltage controlled oscillator includes a variable capacitor stage connected at the input of the oscillator amplifier stage and a buffer amplifier stage connected at the output of the oscillator amplifier stage. The buffer amplifier of one embodiment includes a pair of complementary FETs having common gates connected to the common drains of the FETs of the oscillator amplifier stage. The buffer amplifier stage also include an inductor and a capacitor connected between common drains of the buffer amplifier FETs and the output.

27 Claims, 4 Drawing Sheets

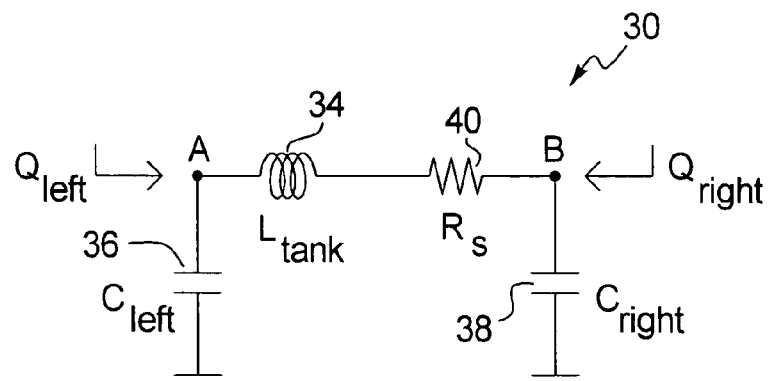
FIG. 3a
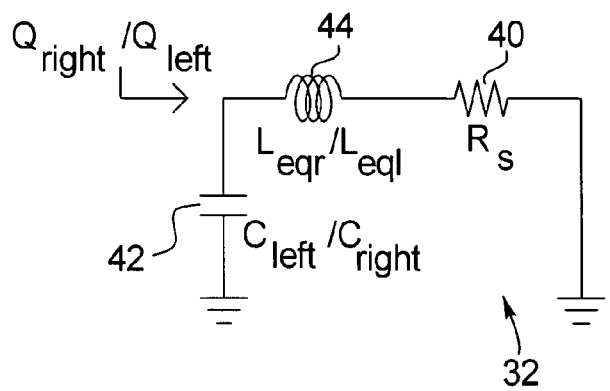
FIG. 3b
FIG. 4
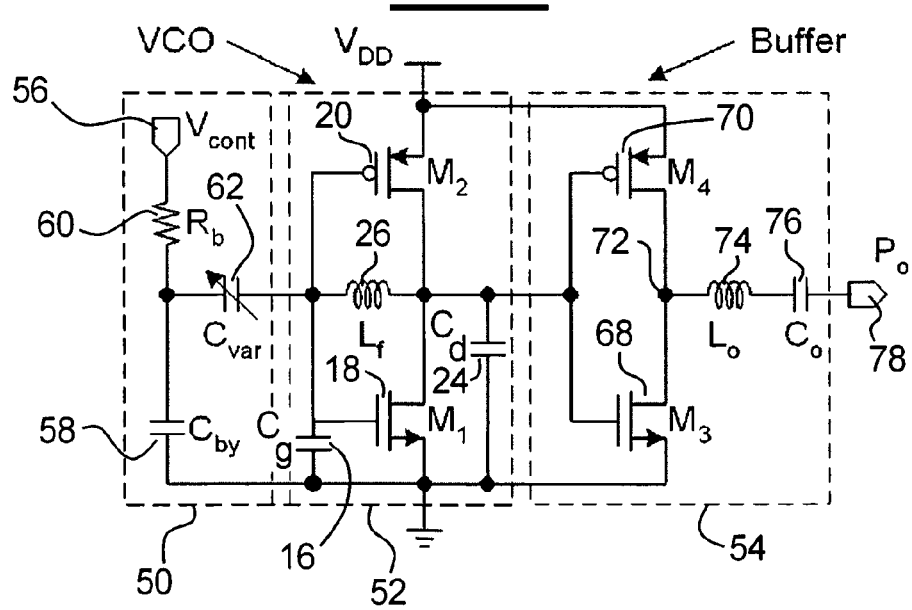

| Ref. | $V_{DD}$ [V] | $I_{DC}$ [mA] | PN [dBc] | Freq. [GHz] | Power [dBm] | FOM [dBc] | Tech. [μm] |
|---|---|---|---|---|---|---|---|
| F. 12(d) | 3.3 | 15.0* | -114 | 10.5 | +0.5 | -180.5 | 0.35 |
| F. 12(c) | 3.3 | 15.0* | -121.7 | 6.9 | +5.1 | -183.8 | 0.35 |
| F. 12(b) | 2.5 | 8.93* | -118.9 | 5.9 | +1.8 | -183.8 | 0.35 |
| F. 12(b) | 2.0 | 4.63* | -118.1 | 6.0 | -2.5 | -187.0 | 0.35 |
| F. 12(a) | 2.0 | 4.66* | -123.2 | 2.53 | +1.8 | -184.6 | 0.35 |
| F. 12(a) | 1.5 | 2.42* | -116.5 | 2.55 | -3.4 | -182.1 | 0.35 |
| [2] | 1.5 | 4.7** | -117 | 5.35 | - | -183.1 | 0.25 |
| [8] | 2.5 | 2** | -112 | 5.8 | +0.9 | -180.3 | 0.25 |
| [9] | 2.5 | 5.5** | -114 | 5.0 | - | -176.6 | 0.25 |
| [10] | 2.7 | 4.0** | -110 | 4.7 | - | -173.1 | 0.35 |

\* Half of the bias current is considered as VCO core current

\*\* VCO core current only

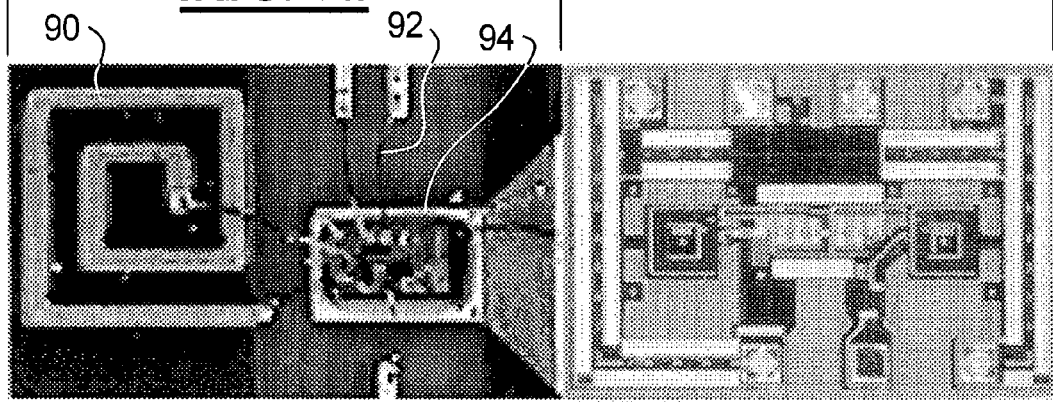
FIG. 7a
FIG. 7b
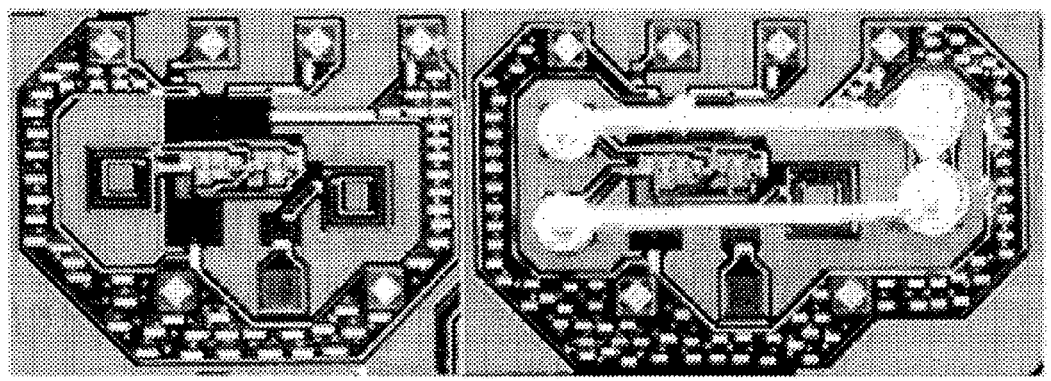
FIG. 7c
FIG. 7d

COMPLEMENTARY VOLTAGE CONTROLLED OSCILLATOR

BACKGROUND OF THE INVENTION

1. Field of the Invention

The present invention relates generally to an electrical oscillator circuit and, in particular, to a voltage-controlled oscillator with complementary transistors.

2. Description of the Related Art

Wireless radio communications systems transmit voice and other data between fixed transceivers and mobile radio communications terminals, or between two mobile terminals, via the propagation of radio frequency (RF) electromagnetic waves. It is essential to the functionality of such wireless communication systems that a stable and accurate generation of oscillating electrical signals be provided. The oscillating signals are supplied by oscillators, such as voltage controlled oscillators, connected in the communications system circuitry. Low phase noise oscillators are important components in wireless communication systems, particularly since phase noise critically affects the sensitivity of wireless transceivers. With advancements in sub-micron CMOS (Complementary Metal Oxide Semiconductor) technology, CMOS technology has become widely used for low cost and highly integrated RFICs (Radio Frequency Integrated Circuits).

Recently, single-chip transceivers that integrate both digital and RF circuits onto one chip using CMOS technology have been introduced. Among the building blocks in single-chip RFICs, design and implementation of a fully integrated low noise CMOS VCO (Voltage Controlled Oscillator) is known as a challenging circuit block because of the in-born limitations of silicon CMOS process technology. Most of the previously reported publications about CMOS VCOs describe the use of negative-$G_m$ differential topology. In these publications, in order to optimize the phase noise performance, researchers stress the importance of layout issues such as active and passive device design, and design of the floor plan of the layout to reduce the side effects of the parasitic characteristics that are inherent in CMOS technology. See the publications by Thomas H. Lee, "*The Design of CMOS Radio-Frequency Integrated Circuits*", Cambridge University Press, 1998; Chin-Ming Hung, Brian A. Floyd, Namkyu Park, and Kenneth K. O, "*Fully Integrated 5.35 GHz CMOS VCOs and Prescalers,*" IEEE Trans; and Donhee Ham and Ali Hajimiri, "*Concepts and Methods in Optimization of Integrated LC VCOs,*" IEEE ISSCC. Vol. 36, No. 6, June 2001.

In negative-$G_m$ based sub-micron CMOS differential VCOs, the complementary structure shows a better performance than an NMOS-only (Negative-channel Metal Oxide Semiconductor) structure as result of the reduced hot carrier effect, better up/down swing symmetry, and higher transconductance of the constituting transistors.

Thus, by using low parasitic, simple, and high transconductance oscillator topology, there exists greater potential in the design of a low noise oscillator for use at high frequencies or with low power. Traditionally, a Colpitts oscillator, which has a simple oscillator core, has been the most favored topology for low phase noise. See the publication by Lawrence E. Larson, "*Integrated Circuit Technology Options for RFICs-Present Status and Future Directions,*" IEEE Journal of Solid State Circuits, Vol. 3, No. 3, March 1998. However, since the conventional Colpitts oscillator needs additional circuit elements for bias and buffer interfaces, its oscillation performances may be degraded by the parasitic effects in the circuit at high frequencies.

Due to the large number of passive and active components employed in conventional voltage-controlled oscillators (VCOs), which incur various parasitic effects, it used to be preferable to implement the circuitry in printed circuit boards with passive and active components mixed together rather than to integrate the circuit in silicon. However, the printed circuit board implementation causes high phase noise, resulting in serious problems in wireless communication, and occupies a large area that runs counter to the miniaturization trend of current wireless mobile stations and communication systems.

In addition to their use in wireless telecommunications, voltage controlled oscillators are used in many other types of devices, from computer mice, audio systems, telephones, computers, MP3 players, PDAs (Personal Digital Assistants), GPS (Global Positioning Satellite) devices to devices operating under the CDMA (Code Division Multiple Access), GSM (Global System for Mobile Communications), Bluetooth, WLAN (Wireless Local Area Network), and Zigbee standards.

In a typical wireless telephone or telecommunications device, a voltage controlled oscillator is provided as the local oscillator (LO) in the circuit and is connected to mixers in both the transmission and reception signal paths to provide the carrier signal for frequency synthesizing. If the LO (Local Oscillator) output contains phase noise, both the down-converted and up-converted signals are corrupted. Phase noise can be defined as random timing fluctuations in an oscillator period. Phase noise causes the ideal signal to be spread in the frequency spectrum, which results in frequency instability in the oscillator. Phase noise is generally specified in dBc/Hz at a given offset frequency from the particular carrier frequency. Therefore, phase noise can be found by measuring the ratio of the power spectral density (in a 1-Hz bandwidth) at a given offset frequency to the total power at the carrier frequency.

A typical voltage controlled oscillator has three functional portions of the circuit, namely a tank stage for selecting the oscillation frequency, an oscillation amplifier stage for amplifying the oscillation frequency signal selected by a tank stage, and a buffer amplifier stage for buffering and amplifying the final output signal. Many of the components in the traditional oscillator circuit have significant parasitic characteristics or parameters particularly at radio frequencies, resulting in poor performance of the circuit in a wireless communications system.

Traditionally, the Colpitts oscillator, which has a simple oscillator core, has been a favored topology for a low phase noise oscillator. However, since the conventional Colpitt oscillator needs additional circuit elements over and above those required for the oscillator core for bias and buffer interfaces, the oscillation performance of the Colpitts oscillator in practice may be degraded by the parasitic characteristics of these additional circuit elements at high frequencies. FIG. 1 shows the previous single-ended VCO implementation. The conventional VCO consists of a tank circuit 4 for selecting the oscillation frequency, an oscillation amplifier 2 for amplifying the selected oscillation frequency signal selected by the tank circuit 4, and a buffer amplifier 3 for buffering and amplifying the final output signal. In particular, the tank circuit 4 has an input for receiving a control voltage $V_c$. The control voltage is filtered by a capacitor $C_1$ and is provided to an inductor $L_1$ and a diode $D_1$. Capacitors $C_2$ and $C_3$ are connected to an inductor $L_2$ which then provides the frequency signal through capacitor $C_4$. In the oscillator amplifier 2, the frequency signal is amplified by a transistor $Q_1$ that has bias and buffer elements resistor $R_1$ and resistor $R_2$ and capacitors $C_5$ and $C_6$. The buffer amplifier 3 also has a transistor $Q_2$ as well as a number of further bias and buffer elements resistors $R_3$ and $R_4$, capacitors $C_7$, $C_8$, $C_9$, $C_{10}$ and $C_{11}$, and an inductor $L_3$. The frequency signal is provided at the output of the voltage controlled amplifier at $P_0$.

SUMMARY OF THE INVENTION

A voltage controlled oscillator is provided according to the teachings of the present invention. The oscillator addresses and mitigates the problems explained above. High performance and low phase noise are achieved by the present circuitry structure, and in addition performance degradation is prevented with reduced passive components so as to decrease the parasitic effects present in such components. In a preferred embodiment of this invention, a complementary Colpitts (also termed C-Colpitts) oscillator topology is provided that is effectively composed primarily of two components, a complementary N- and P-MOS transistor pair and an inductance. Preferably, the core oscillator amplifier circuit requires no or few additional circuit elements for bias and buffer interfaces. Since the proposed C-Colpitts oscillator is simple, has a complementary structure, and provides high transconductance, better oscillation performance can be achieved.

A voltage controlled oscillator is built on the core oscillation amplifier, and includes a variable capacitance stage at the input end and a buffer amplifier at the output. In one embodiment, the buffer amplifier has a complementary transistor pair like the oscillation amplifier.

The phase noise properties have been confirmed with simulations and the present invention shown to provide the design guideline to optimize the phase noise performance. The phase noise properties of the C-Colpitts VCOs have also been proven with experimental results. Further, the performance of the present C-Colpitts VCO which was fabricated with 0.35 mm CMOS technology have been compared with the findings from earlier oscillator constructions, as these earlier oscillators were described in various publications.

The present oscillator provides a circuit design that facilitates integrated circuit layout of active and passive elements to optimize the phase noise performance, and the aids in design of a floor plan of the layout to reduce the side effects of the parasitic characteristics in CMOS technology, for example.

BRIEF DESCRIPTION OF THE DRAWINGS

FIGS. 3a and 3b are circuit diagrams of equivalent circuits of the oscillator amplifier;

FIG. 4 is a circuit diagram of a voltage controlled oscillator using the complementary oscillator amplifier and including a variable capacitance stage and a buffer stage according to the present invention;

FIGS. 7a, 7b, 7c and 7d show photomicrographs of fabricated oscillators of the present invention for operation at operating frequencies of: (6a) 2 GHz, (6b) 5 GHz, (6c) 6 GHz and (6d) 10 GHz.

DETAILED DESCRIPTION OF THE PREFERRED EMBODIMENTS

Figure 2:
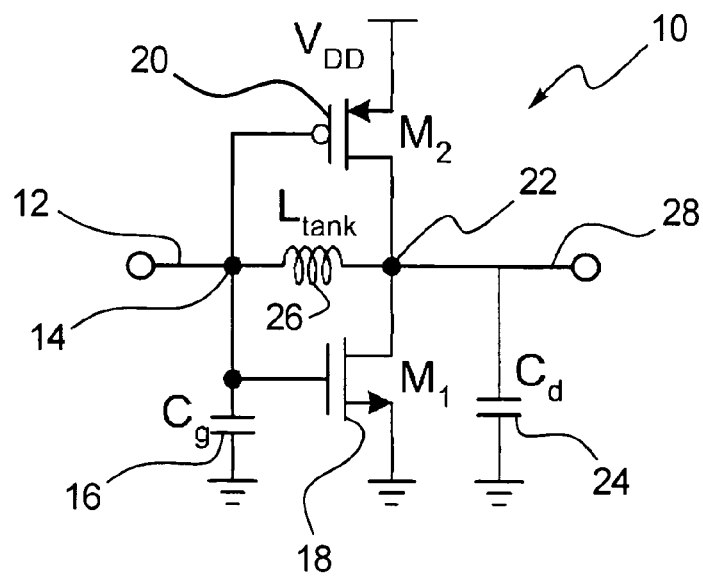
FIG. 2 is a circuit diagram of a complementary oscillator amplifier according to the principles of the present invention.

FIG. 2 shows the present complementary voltage controlled oscillator amplifier core 10. The present oscillator amplifier core 10 may be referred to as a Complementary Colpitts (or C-Colpitts) oscillator. The oscillator core 10 has an input 12 at which a frequency signal is provided to a node 14. The node 14 is connected by a capacitance $C_g$ 16, which is the overall gate-source capacitance, to ground. The node 14 is connected to the gates of first and second transistors 18 and 20, also marked $M_1$ and $M_2$ in FIG. 2. The first transistor 18 is an N-type FET (Field Effect Transistor) that has its source connected to ground. The second transistor 20 is a P-type FET that has its source connected to a supply voltage $V_{DD}$. The presence of two types of transistors, the N-type and the P-type, is referred to as complementary transistors.

The drains of the two transistors 18 and 20 are connected together. Thus, the transistors 18 and 20 share a common bias current, since the current flow path is through both transistors 18 and 20 between the power supply and ground. The transistor 20 is an inverter type transistor with an inverter at the gate lead, while the transistor 18 does not have an inverter at its gate. The common drains of the transistors 18 and 20 are connected at a node 22. A capacitance $C_d$ 24 is connected from the node 22 to ground. The capacitance 24 is the drain-source capacitance.

An inductance $L_{tank}$ 26 is connected between the nodes 14 and 22, in other words between the gates and drains of the transistors 18 and 20. The inductance 26 may be a separate inductor element that is connected on the chip of the CMOS transistors, or the inductance 26 may be the inductance of a bonding wire on the chip. Bonding wires are used to connect circuit chips in a case to the leads that extend from the case, for example. The use of an inductor element provides a higher degree of accuracy of the inductance value, but occupies a larger space on the chip. The use of the inductance of the bonding wire has less accuracy for the inductance value, but uses considerably less space on the chip and therefore enables the present circuit to be used in more compact devices. Thus, the two different embodiments (the inductance as a separate element or as the bond wire) enable the user of the present circuit to select the one most appropriate for their needs.

The present oscillator circuit may use instead the parasitic parameters of other physical structures of the circuit, including leads, wires, bond wires, bonding pads, lands, semiconductor structures or any other characteristic or physical part of the circuit, whether an integrated circuit, printed circuit board or other circuit construction, to provide operational circuit elements of the circuit. Passive components of the circuit are replaced by the parasitic effects of the physical circuit to reduce the number of separate passive components needed for the circuit.

The use of the inductance of the bonding wire as the inductance component in the circuit relies on the parasitic parameters of the physical circuit to provide the operating circuit components. The parasitic parameters are significant at the radio frequencies, and so may be utilized in the circuit design, rather than being considered a nuisance to be eliminated. It is also foreseen to substitute other circuit components both of the core 10 as well as of the associated circuit portions as will be discussed later with the parasitic parameters of the physical circuit. This is done by skillful design of the physical circuit and careful utilization of the chip space.

In FIG. 2 the transistors 18 and 20 the inductor 26, and the gate-source capacitor 16, and the drain-source capacitance 24 together constitute an oscillator amplifier core. The illustrated circuit has another characteristic that relates to parasitic parameters, and that is that few circuit components are required. Separate circuit components each have their own parasitic characteristics and these must be taken into account during design of the circuit, particularly for circuits to be used at high frequencies. Here, there are fewer separate circuit elements and so fewer parasitic characteristics to effect the operation of the circuit. As a result, fewer negative effects are imposed on the circuit operation, with less noise in the circuit being a result.

The oscillator amplifier core 10 has an output at 28 from the node 22. Since the gate of the N-type FET 18 is connected to the gate of the P-type FET 20 and the drain of the N-type FET 18 is connected to the drain to the P-type FET 20, the FETs may be described as connected in a parallel type of connection. The transistors 18 and 20 are in the present embodiment MOS (Metal Oxide Semiconductor) transistors, and in a preferred embodiment are CMOS (Complementary Metal Oxide Semiconductor) transistors.

Since the simple and complementary structure of the C-Colpitts oscillator core 10 decreases the parasitic components and increases the negative conductance, the potential of high performance oscillation increases. The negative conductance generation behavior is explained as follows; at frequencies above $\omega_{sr}$, series resonance frequency of $L_{tank}$-$C_g$, due to the second order phase transition of the series $L_{tank}$-$C_{gs}$ circuit, the phase transition at the gate-node of the transistor w.r.t. drain-node becomes larger than 90°, and this leads to the drain current inversion at the drain node and the generation of negative conductance at the complementary Colpitts oscillator. Thus, the complementary Colpitts oscillator oscillates in the frequency region $\omega > \omega_{sr}$.

The Leeson's phase noise equation for such a circuit is given as:

$$L(\Delta\omega) = F \frac{kT}{2P_{sig}} \frac{\omega_o^2}{Q^2 \Delta\omega^2} \quad (1)$$

where, Q is the loaded quality factor of the LC tank circuit, $\Delta\omega$ is the frequency offset, F is the device excess noise factor. From Leeson's phase noise equation, it is known that the phase noise performance can be improved by increasing the loaded quality factor Q and the signal power $P_{sig}$. Generally, since the large inductance provides a better Q-factor and larger oscillation, an oscillator having a tank circuit with a high-Q or high inductance is better for low phase noise oscillator.

However, since in practice oscillators have a limited supply voltage, the oscillation swing will be limited within supply voltage. When the tank structure is optimized by the increase of the tank inductance for better phase noise performance, the higher inductance of the tank inductor will increase just the oscillation voltage swing without considering the supply voltage limitation. Since the supply voltage limits the voltage swing, the phase noise improvement with the high inductance of the tank inductor (a high L/C ratio tank circuit) would be limited eventually. An additional increase in inductance does not improve the phase noise.

The Hajimiri's phase noise equation in the $1/f^2$ region is expressed as $$L(\Delta\omega) = \frac{2kT\Gamma_{rms}^2}{R_{tank} q_{max}^2} \cdot \frac{1}{\Delta\omega^2} = \frac{2kT\Gamma_{rms}^2}{R_{tank}(C_{tank} V_{peak})^2} \cdot \frac{1}{\Delta\omega^2} \quad (2)$$

where, $\Gamma_{rms}$ is the rms value of the impulse sensitivity function and $q_{max}$ is the maximum charge swing.

From equation (2), when an oscillator is oscillating in the supply voltage limited region, the phase noise is improved by increasing the tank capacitance $C_{tank}$ and equivalently removing the waste of tank inductance. Optimization of the tank structure by removing the wasted inductance, or excess inductance, to maximize the maximum charge swing is a more advanced approach than by increase the tank inductance (increasing the L/C ratio) to maximize the oscillation swing. However, maximizing the charge swing by removing the excess inductance still has a shortcoming. Since removing wasted inductance of the tank inductor is the same as sacrificing the maximum Q-factor of the tank inductor available, the best phase noise performance that is potentially achievable in the oscillator cannot be obtained with this approach. Thus, the best tank structure optimization method is to devise a tank structure which avoids the supply voltage pushing/limitation with a high Q-factor and a high inductance of the tank inductor without sacrificing the excess inductance.

An advantage of the present circuit arrangement is that it suppresses hot carrier noise. The present circuit utilizes the inherent parasitic parameters to provide the capacitances and inductances in the circuit, thereby eliminating the separate circuit elements that are otherwise required to form an oscillator circuit.

Equivalent circuits are shown in FIGS. 3a and b, wherein the circuit is shows as a π-resonant circuit 30 and its equivalent LC parallel resonant circuit 32. In FIG. 3a, both ends of the inductor $L_{tank}$ 34 are connected with different capacitance values of capacitance $C_{left}$ 36 and $C_{right}$ 38, respectively. A resistance $R_s$ 40 is provided in series with the inductance 34. The two series RLC branches seen from nodes A and B in FIG. 3a can be modified as an equivalent LR circuit as shown in FIG. 3b, with equivalent capacitance $C_{left}/C_{right}$ 42 and inductance $L_{eqr}/L_{eql}$ 44 as well as the resistance $R_s$ 40. Thus, in the π-resonant circuit, two different equivalent parallel RLC resonant circuits can exist, of which the amplitudes of $Q_{left}$ and $Q_{right}$ can be different by adopting different capacitance values of $C_{left}$ and $C_{right}$. Thus, by adjusting the Q-factor of a wanted node at any value, the oscillator's tank circuit can be optimized with a high-Q factor and a high inductance of the tank inductor at any oscillation frequency. However, an asymmetric capacitance tank structure can only be applied to the oscillator with only one supply voltage pushing/limitation node.

The asymmetric capacitance tank structure can be easily applied to the present complementary Colpitts oscillator shown in FIG. 2. As shown in FIG. 2, the circuit portion $C_g$-$L_{tank}$-$C_d$ constitutes a π-resonant circuit and the drain node is the only node that experiences the supply voltage pushing/limitation. Interestingly, in a C-Colpitts oscillator, the gate node does not experience the supply voltage pushing/limitation during the oscillation because the impedance seen at the gate node consists of only inductances and capacitances (L and Cs). Thus, by reducing the equivalent Q-factor of the series $L_{tank}$-$C_g$ circuit seen at the drain node (by adjusting the capacitance ration $C_d/C_g>1.0$), the supply voltage pushing/limitation of the C-Colpitts oscillator can be avoided for any values of Q-factor and $L_{tank}$ without worrying about the voltage amplitude swing at the gate node.

In one aspect of the invention, the present oscillator is a complementary Colpitts oscillator configured as a complementary-VCO that includes, as shown in FIG. 4, a variable capacitance stage 50, an oscillation amplifier stage 52 and a buffer amplifier stage 54. The variable capacitance stage 50 provides for control of the oscillating frequency of the oscillator by changing the capacitance value according to an input voltage $V_{cont}$ at 56. The input voltage is, for example, a channel selection output of a PLL (Phase Locked Loop) circuit or a frequency synthesizer. The variable capacitance stage 50 includes a shunt capacitor $C_{by}$ 58 between a series resistor $R_b$ 60 and ground, which are provided for the purpose of signal blocking. A series variable capacitor $C_{var}$ 62 is provided connected between the bypass shunt capacitor 58 and the blocking resistor 60. The variable capacitor 62 of one embodiment is a varactor, so that its capacitance varies with the reverse voltage. The capacitance 62 also takes advantage of various capacitances of the FETs according to the various input voltage levels.

The oscillation amplifier stage 52 of FIG. 4 has the circuit elements that were discussed in conjunction with FIG. 2. The circuit includes the complementary FETs M1 and M2, 18 and 20, which share a common bias current from the supply voltage $V_{dd}$, capacitances $C_g$ and $C_d$, 16 and 24, and an inductor $L_f$, 26, which is identified in the circuit of FIG. 2 as $L_{tank}$. The FETs 18 and 20 and inductor 26 and can generate and amplify the desired frequency signal while composing negative resistance. The input to the oscillation amplifier is at its combined gates from the other end of the variable capacitor 62. The complementary FETs 18 and 20 share a common bias current. The inductor 26 is connected between the gate and the drain so that the inductor 26 is placed in the middle between the top FET 20 and the bottom FET 18. In terms of DC, the two FETs 18 and 20 form complementary diode type connections. Here, the inductor 26 is preferably the inductance of the wire bonding of the circuit chip, which provides not only smaller circuit size but also better performance.

The oscillation frequency is determined by the values of the variable capacitance 62 and the inductance 26 according to the formula $$f = \frac{1}{2\pi\sqrt{LC}},$$

where L is the value of the inductance 26, C is the value of the variable capacitance 62, and f is the frequency of the oscillation signal. Thus, the variation of the frequency of oscillation can be seen to vary with the changes in the capacitance 62.

The buffer amplifier stage 54 includes complementary FETs $M_3$ and $M_4$, 68 and 70, which share a common bias current, and can buffer, amplify and output the generated signal by the oscillation amplifier 52. The input of the buffer amplifier 54 is at the combined gates of the FETs 68 and 70, which is the output from the interconnection of the drains of the FETs 18 and 20 in the oscillation amplifier stage 52. The complementary FETs 68 and 70 are connected to share a common bias current from the voltage supply $V_{dd}$. The upper FET 70, also denoted $M_4$, is an inverter amplifier, having an inverter at its gate lead.

The drains of the complementary transistors 68 and 70 are connected together at a node 72, which is connected to a series inductor $L_o$, 74, and a series capacitor $C_o$, 76. The inductor 74 is used for matching output impedance and the capacitor 76 is used for DC blocking and for matching the output impedance. An output 78 is provided for the voltage controlled oscillator circuit, the output being taken from the output capacitor 76.

The output signal may be used in a variety of ways. In a typical wireless communications application, the output signal is connected to mixers on each of the transmit and receive side of the communications device. A frequency divider (not shown) may be used to provide the oscillator frequency signal to these two mixers. The present circuit finds utility in various applications and at various frequencies. Examples of frequencies at which the present oscillator may operate include: 900 MHz, 2.1 GHz, and 6 GHz.

In FIG. 4, the embodiment of the oscillator easily implements the tank circuit with a capacitance as seen by the gate stage of the complementary FETs 18 and 20 and the inductor 26 that is connected to the FETs in parallel. The circuit has a design that enables the reduction of the number of passive components required compared to the conventional VCOs. The present voltage controlled oscillator reduces the negative resistance by half with the same amount of current, because the FETs 18 and 20 induce negative resistance. Therefore, the phase noise characteristics of the circuit are improved by reducing the channel noise generated in the active components. The symmetric circuit structure improves the high frequency distortion characteristics as well as reduces the phase noise components caused by flicker noise.

In the buffer amplifier 54, since the gates of the inverter amplifier composed of the FETs 68 and 70 are directly connected to the drains of FETs 18 and 20 of the oscillation amplifier, DC signals can be biased without the use of passive devices. Also, the symmetric structure of the inverter amplifier reduces the harmonic distortion even with a large output signal.

The inductor 74 that is serially connected to the inverter amplifier composed of the FETs increases the output impedance of the inverter amplifier, thus leads to improve the high frequency amplification characteristics. The capacitor 76 at the output stage is applied to block any DC component.

Figure 1:
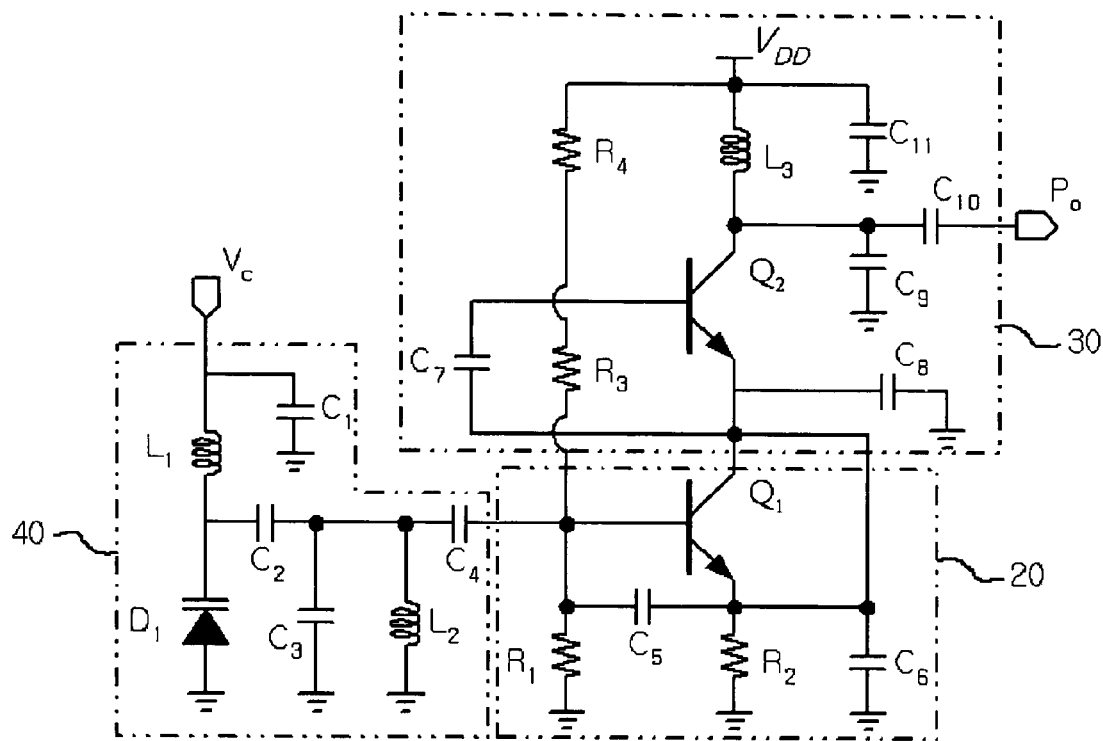
FIG. 1 is a circuit diagram of a known single-ended voltage controlled oscillator implementation, as an example.

FIG. 4 shows a complete schematic of the present complementary Colpitts oscillator constructed to be used as a VCO (voltage controlled oscillator), which includes a directly coupled inverter as a buffer. In a particular embodiment of the circuit of FIG. 4, the capacitance $C_{var}$ 62 is an accumulation-mode MOS varactor, the resistance $R_b$, 60, is an AC blocking resistor, and the capacitance $C_{by}$ 58 is the bypass capacitor to AC ground. In preferred construction, the varactor 62 is connected on the gate-side of the oscillator core in order to obtain a wider tuning range. The inductance $L_o$ 74 and the capacitance $C_o$ 76 are added for impedance matching and DC blocking, if needed, but can be eliminated if desired. Compared with the previous single-ended VCO implementation example shown in FIG. 1, the present VCO with the complementary Colpitts oscillator is quite simple even with a buffer amplifier.

Since the invention can easily implement the tank circuit with a capacitance seen by the gate stage of the complementary FETs 18 and 20 and an inductor that is connected to the FETs 18 and 20 in parallel, it has a structural merit enabling the reduction in the required number of passive components. Compared to the conventional VCOs, the present VCO reduces the negative resistance by half with the same amount of current, because the FETs 18 and 20 induce negative resistance, respectively. Therefore, the phase noise characteristics are improved by reducing the channel noise generated in the active components. The symmetric circuit structure of the present oscillator improves the high frequency distortion characteristics as well as reduces the phase noise components caused by flicker noise.

The variable capacitance 62 connected to the gates of FETs 18 and 20 in the oscillator amplifier can be controlled by the input voltage. Thus, the input voltage can control the oscillation frequency.

In the buffer amplifier, since the gates of the inverter amplifier which is composed of the FETs 68 and 70 are directly connected to the drains of the FETs 18 and 20 of the oscillation amplifier, DC can be biased without passive devices. Also, the symmetric structure of the inverter amplifier reduces the harmonic distortion even with the large output signal.

The inductor 74 that is serially connected to the inverter amplifier composed of the FETs 68 and 70 increases the output impedance of the inverter amplifier, thus leads to improve the high frequency amplification characteristics. The capacitor 76 at the output stage is applied to block DC component.

Figures 5, 6:
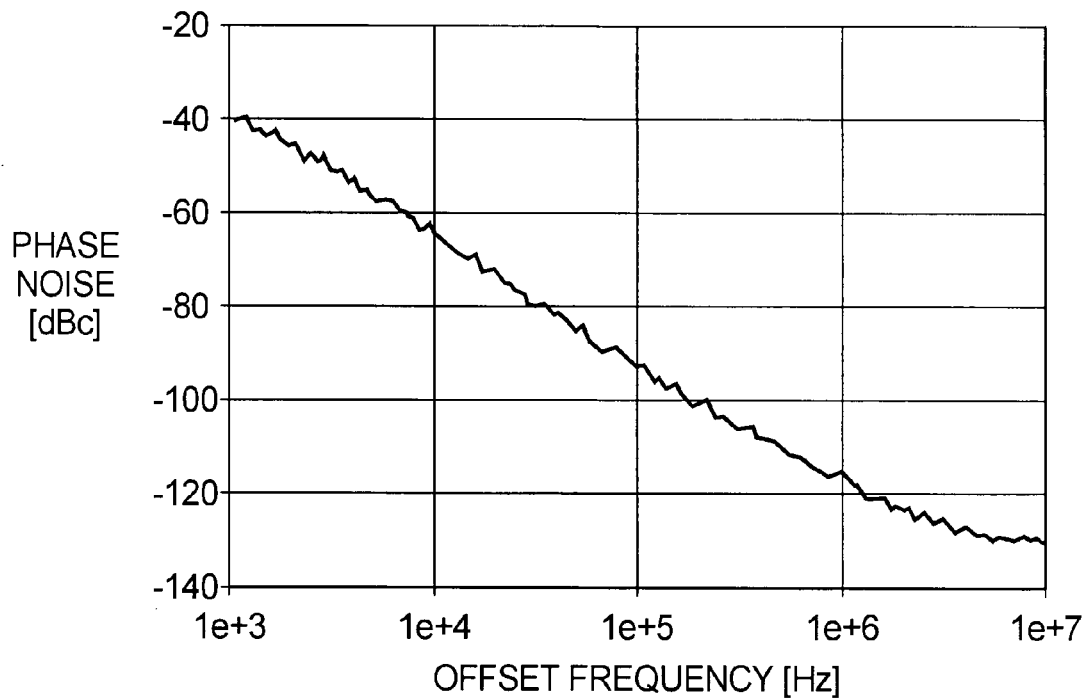
FIG. 5 is a graph that shows measured phase noise at 6.0 GHz as a function of offset frequency for the present oscillator circuit.
FIG. 6 is a table showing test results of circuits constructed according to the present invention and circuits as disclosed in know publications.

In FIG. 5, a graph of the phase noise for the present oscillator is shown. The graph shows the measured phase noise (indicated on the ordinate) of the oscillator circuit operating at 6.0 GHz as a function of offset frequencies (indicated on the abscissa). In the graph can be seen that the phase noise is −118.1 dBc at a 1 MHz offset from the 6 GHz oscillation frequency. As such, the noise signal is reduced compared to known circuits. A construction of the present voltage controlled oscillator circuit dissipates 4.6 mA of current from a 2.0 volt supply.

The performance of voltage controlled oscillators has been evaluated for various power dissipations by changing the supply voltage. The table shown in FIG. 6 summarizes the measurement results in comparison with other reported 5 GHz band VCOs. The fabricated VCOs were not optimized for a minimum phase noise following an analysis of the circuit. Even so, the fully integrated 5 GHz and 6 GHz band VCOs reported in FIG. 6 provide better performance than that of the corresponding previous circuits that were implemented using 0.25 μm CMOS technology as they are designed closer to the optimum point. With the 2 GHz design, the loading capacitance is significantly smaller (only around 0.5 Pf) than the optimum point which leads to higher phase noise.

In FIG. 6, the first column refers to circuits that were tested, wherein those denoted with "F" are circuits according to the present design and those indicated with numbers enclosed within brackets are known constructions, some of which have been optimized for reduced phase noise. The second column indicates the supply voltage, the third column indicates the DC current, the fourth column indicates the tested phase noise (wherein the low phase noise of the present, non-optimized circuits can be seen), the fifth column indicates the oscillation frequency, the sixth column indicates the power level at the output, the seventh column indicates a figure of merit (not important here), and the eighth column indicates the technology of the foundry process for the chip as indicated by the gate length on the chip.

Several VCOs with different frequencies of oscillation: 2 GHz, 5 GHz, 6 GHz, and 10 GHz bands, have been fabricated based on 0.351 μm CMOS technology. With 2 GHz and 10 GHz band VCOs, the inductors are implemented as an external PCB (Printed Circuit Board) spiral and on-chip bond-wires, respectively, while on-chip spiral inductors are used for the 5 GHz and 6 GHz band VCOs. FIGS. 7a, 7b, 7c and 7d show photomicrographs of fabricated VCOs constructed for operation at: 2 GHz, 5 GHz, 6 GHz, and 10 GHz bands, respectively. For example, the photomicrograph of FIG. 7a shows an inductor coil 90, bond wires 92 and the voltage controlled oscillator chip 94. Structures that will be understood by those of skill in the art as forming voltage controlled oscillators are shown on the drawings FIGS. 7b, 7c and 7d.

The present circuit utilizes the parasitic parameters of the physical circuit operating at high frequencies to reduce many of the separate circuit elements that would be required at lower frequencies. It is foreseen that this effect may provide an operable oscillator circuit as low as 400 to 500 MHz. Higher frequencies are, of course, included, such as at the 24 and 38 GHz bands.

Voltage controlled oscillators have four characteristics or factors. These include phase noise, linearity, power consumption and size. Phase noise is the most important factor in many applications, including in wireless communications. The present circuit reduces phase noise from the oscillator. This results in lower noise in the wireless communications circuit and clearer, more reliable communications.

The present voltage controlled oscillator has particular utility in wireless telecommunications, voltage controlled oscillators are used in many other types of devices, from computer mice, audio systems, telephones, computers, MP3 players, PDAs (Personal Digital Assistants), GPS (Global Positioning Satellite) devices to devices operating under the CDMA (Code Division Multiple Access), GSM (Global System for Mobile Communications), Bluetooth, WLAN (Wireless Local Area Network), and Zigbee standards. The present oscillator may also be used in linear amplifiers, hybrid electronics, power hybrids, and linear regulators, as well as other electrical devices.

The high performance integrated CMOS oscillator provides a competitive development of in wireless CMOS SOC (System-On-Chip) products. Even though CMOS process technology advances in operation frequency, the higher 1/f noise and hot-carrier noise of the transistor with in-born limitations of silicon process such as limited dimension (metal resistance), substrate loss and limited Q of passive devices, make the design of high performance CMOS VCOs more challenging. For the design and optimization of high performance integrated VCO using sub-micron CMOS process technology, the compact complementary-Colpitts CMOS oscillator core topology is effectively composed of two components, a complementary N- & P-MOS transistor pair and an inductor. The oscillation mechanism of the proposed Complementary-Colpitts oscillator is analyzed based on small signal one-port oscillator model. Based on the one-port analysis and the existing phase noise model, the phase noise equation of the proposed complementary Colpitts oscillator is derived as the function of the oscillation frequency, the Q-factor of the tank circuit and bias current. The phase noise equation provides the design guideline to optimize the phase noise of the present oscillator, of which the Colpitts VCOs are fabricated using CMOS technology.

The present invention describes construction of an oscillator circuit in CMOS technology. It is foreseeable that the principles of the present invention can be applied to other types of circuit technology, and so the scope of the present invention is sufficient to extend to these other areas of technology.

Thus, the present invention provides an oscillator that optimizes the phase noise performance, has minimum passive components, and low parasitic parameters. High performance and low phase noise are achieved by the present circuit. The present oscillator further prevents performance degradation with reduced passive components so as to decrease parasitic parameters.

The present oscillator has a complementary structure, up-down swing symmetry, suppresses hot carrier noise, and has a high transconductance. The oscillator has a simple core with high transconductance, more potential for the low noise oscillation and operates a high frequencies with low power.

In the circuit, a variable capacitance stage, which includes a resistance for current control to the oscillation amplifier and buffer amplifier, feeds a signal to an oscillation amplifier stage, which includes a shared negative resister and establishes the bias current to the complementary transistor pair. The inductance in the oscillation amplifier stage that is connected between the complementary transistors may either be an inductance of the bond wire or may be an external inductor. The present oscillator also has a buffer amplifier, which is constructed to share the bias current and acts as an inverter amplifier.

Although other modifications and changes may be suggested by those skilled in the art, it is the intention of the inventors to embody within the patent warranted hereon all changes and modifications as reasonably and properly come within the scope of their contribution to the art.

We claim:

1. An oscillation amplifier core, comprising:
    first and second transistors connected with drain and source paths of said transistors connected together at a node, said drain and source paths being connected between power and ground, one of said first and second transistors includes an inverter at a control lead, wherein one of said first and second transistors has an inverter at its control lead;
    control leads of said first and second transistors connected in common; and
    an inductance between said node and said control leads of said first and second transistors.

2. An oscillation amplifier core as claimed in claim 1, wherein said first and second transistors are an N-type FET and a P-type FET, and said control leads are gates of said FETs.

3. An oscillation amplifier core as claimed in claim 1, further comprising:
    a first capacitance connected between said common connected control leads and ground; and
    a second capacitance connected between said node and ground.

4. An oscillation amplifier core as claimed in claim 1, wherein said inductance is an inductor.

5. An oscillation amplifier core as claimed in claim 1, wherein said first and second transistors are integrated transistors on a chip, and wherein said inductance is an inductance of a bond wire connected to said chip.

6. An oscillator amplifier core, comprising:
    first and second FETs each having a source and a drain and a gate, said first and second FETs being of mutually complementary type, one of said first and second FETs having an inductor at its gate, said gate of said first FET being connected to said gate of said second FET, said drain of said first FET being connected to said drain to said second FET, only one of said first and second FETs having an inverter at its gate;
    an inductance connected between said drain of said first FET and said gate of said first FET;
    a first capacitance connected between said gate of said first FET and ground; and
    a second capacitance connected between said drain of said first FET and ground.

7. An oscillator amplifier as claimed in claim 3, wherein said first FET is a P-type FET and said second FET is an N-type FET.

8. An oscillator amplifier core, consisting of:
    first and second FETs each having a source and a drain and a gate, said first and second FETs being of mutually complementary type, one of said first and second FETs having an inductor at its gate, said gate of said first FET being connected to said gate of said second FET, said drain of said first FET being connected to said drain to said second FET, only one of said first and second FETs having an inverter at its gate;
    an inductance connected between said drain of said first FET and said gate of said first FET;
    a first capacitance connected between said gate of said first FET and ground; and
    a second capacitance connected between said drain of said first FET and ground.

9. A complementary voltage controlled oscillator, comprising:
    a variable capacitance stage having a variable capacitor connected to receive an input voltage, said variable capacitor being operable to change capacitance according to changes in input voltage at the input;
    an oscillation amplifier stage connected to said variable capacitance stage,
        said oscillator amplifier stage including first and second complementary transistors connected to share a common bias current, said first and second complementary transistors having their gates connected to one another, only one of said first and second complementary transistors having an inverter at its gate,
        said oscillator amplifier stage including an inductance connected between said gates of said first and second complementary transistors and a drain of said first transistor, said gates and said inductance being connected to said capacitance element of said variable capacitance stage, and
    a buffer amplifier stage connected said oscillation amplifier stage and connected to provide an oscillation frequency at an output.

10. A complementary voltage controlled oscillator comprising:
    a variable capacitance stage having a variable capacitor connected to receive an input voltage, said variable capacitor being operable to change capacitance according to changes in input voltage at the input;
    an oscillation amplifier stage connected to said variable capacitance stage,
        said oscillator amplifier stage including first and second complementary transistors connected to share a common bias current, said first and second complementary transistors having their gates connected to one another,
        said oscillator amplifier stage including an inductance connected between said gates of said first and second complementary transistors and a drain of said first transistor, said gates and said inductance being connected to said capacitance element of said variable capacitance stage, and a buffer amplifier stage connected said oscillation amplifier stage and connected to provide an oscillation frequency at an output;

wherein said variable capacitance stage includes a shunt capacitor and a series resistor, said shunt capacitor being connected between said series resistor and ground for signal blocking, said variable capacitance stage also including a series variable capacitor as said capacitance element.

11. A complementary voltage controlled oscillator as claimed in claim 9, wherein said oscillation amplifier stage includes a gate capacitor connected between said gates and ground and a drain capacitor connected between said drains and ground.

12. A complementary voltage controlled oscillator as claimed in claim 9, wherein said inductance of said oscillation amplifier stage is an inductance of a wire bonding.

13. A complementary voltage controlled oscillator as claimed in claim 9, wherein said inductance of said oscillation amplifier stage is an inductor element.

14. A complementary voltage controlled oscillator as claimed in claim 9, wherein said complementary FETs for diode type connections.

15. A complementary voltage controlled oscillator as claimed in claim 9, wherein said buffer amplifier stage includes complementary FETs connected to share a common bias current and connected to buffer and amplify a signal generated by said oscillation amplifier.

16. A complementary voltage controlled oscillator as claimed in claim 9, wherein said buffer amplifier stage has an input as combined gates of said complimentary FETs of said buffer amplifier stage, said combined gates being connected to interconnected drains of said FETs of said oscillation amplifier stage.

17. A complementary voltage controlled oscillator as claimed in claim 9, wherein said buffer amplifier is connected as an inverter amplifier.

18. A complementary voltage controlled oscillator as claimed in claim 9, wherein said complementary FETs of said buffer amplifier stage include a first FET having an inverter gate and a second FET with a non-inverting gate.

19. A complementary voltage controlled oscillator as claimed in claim 9, wherein said complementary FETs of said buffer amplifier stage include a first P-type FET having an inverter gate and a second N-type FET with a non-inverting gate.

20. A complementary voltage controlled oscillator comprising:

a variable capacitance stage having a variable capacitor connected to receive an input voltage, said variable capacitor being operable to change capacitance according to changes in input voltage at the input;

an oscillation amplifier stage connected to said variable capacitance stage, said oscillator amplifier stage including first and second complementary transistors connected to share a common bias current, said first and second complementary transistors having their gates connected to one another, said oscillator amplifier stage including an inductance connected between said gates of said first and second complementary transistors and a drain of said first transistor, said gates and said inductance being connected to said capacitance element of said variable capacitance stage, and a buffer amplifier stage connected said oscillation amplifier stage and connected to provide an oscillation frequency at an output;

wherein said complementary transistors are connected with their respective drains in common, and further comprising:

an inductor and a capacitor in series between said common drains and an output of said buffer amplifier stage.

21. A complementary voltage controlled oscillator, comprising:

a variable capacitance stage having a variable capacitor connected to receive an input voltage, said variable capacitor being operable to change capacitance according to changes in input voltage at the input, said variable capacitance stage includes a shunt capacitor and a series resistor, said shunt capacitor being connected between said series resistor and ground for signal blocking, said variable capacitance stage also including a series variable capacitor as said capacitance element;

an oscillation amplifier stage connected to said variable capacitance stage, said oscillator amplifier stage including:

first and second complementary FETs connected to share a common bias current, said first and second complementary FETs having their gates connected to one another, said first and second complementary FETs having their drains connected to one another, an inductance connected between said gates of said first and second complementary FETs and said drains of said first and second complementary FETs, said gates and said inductance being connected to said capacitance element of said variable capacitance stage, a gate capacitor connected between said gates and ground;

a drain capacitor connected between said drains and ground; and a buffer amplifier stage connected said oscillation amplifier stage and connected to provide an oscillation frequency at an output, said buffer amplifier stage including:

third and fourth complementary FETs connected to share a common bias current, said third and fourth complementary FETs having their gates connected to one another and to said drains of said first and second complementary FETs, said third and fourth complementary FETs having their drains connected to one another, an inductor and a capacitor in series between said common drains of said third and fourth complementary FETs and an output of said buffer amplifier stage.

22. A complementary voltage controlled oscillator as claimed in claim 21, wherein said first and second complementary FETs include an N-type FET having a non-inverting gate and a P-type FET having an inverting gate.

23. A complementary voltage controlled oscillator as claimed in claim 22, wherein said third and fourth complementary FETs include an N-type FET having a non-inverting gate and a P-type FET having an inverting gate.

24. A complementary voltage controlled oscillator as claimed in claim 21, wherein said third and fourth complementary FETs include an N-type FET having a non-inverting gate and a P-type FET having an inverting gate.

25. A complementary voltage controlled oscillator as claimed in claim 21, wherein said inductance of said oscillation amplifier stage is a parasitic inductance of a physical circuit structure.

26. A complementary voltage controlled oscillator as claimed in claim 25, wherein said physical circuit structure is a bond wire.

27. A complementary voltage controlled oscillator as claimed in claim 21, wherein said inductance of said oscillation amplifier stage is an inductor element.

* * * * *